(12) United States Patent
Jang et al.

(10) Patent No.: US 9,127,197 B2
(45) Date of Patent: Sep. 8, 2015

(54) ALUMINUM DEFICIENT α-SIALON PHOSPHORS, METHOD OF PREPARING THE SAME, AND LED CHIP PACKAGE USING THE SAME

(75) Inventors: Bo-Yun Jang, Daejeon (KR); Sung-Soon Park, Daejeon (KR); Joo-Seok Park, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 913 days.

(21) Appl. No.: 13/273,665

(22) Filed: Oct. 14, 2011

(65) Prior Publication Data

US 2012/0261694 A1 Oct. 18, 2012

(30) Foreign Application Priority Data

Apr. 15, 2011 (KR) .................. 10-2011-0035395

(51) Int. Cl.
*C09K 11/78* (2006.01)
*H01L 33/44* (2010.01)
*C09K 11/08* (2006.01)
*C09K 11/77* (2006.01)
*H05B 33/14* (2006.01)
*H01L 33/50* (2010.01)

(52) U.S. Cl.
CPC ......... *C09K 11/0883* (2013.01); *C09K 11/7734* (2013.01); *H01L 33/502* (2013.01); *H05B 33/145* (2013.01)

(58) Field of Classification Search
USPC ....................... 252/301.4 F; 313/305; 257/98
See application file for complete search history.

(56) References Cited

U.S. PATENT DOCUMENTS

2009/0284948 A1   11/2009   Yamao et al.

FOREIGN PATENT DOCUMENTS

| JP | 2002-363554 | * 12/2002 |
| JP | 2002363554 | 12/2002 |
| JP | 2005-162808 | * 6/2005 |
| JP | 2005162808 | 6/2005 |
| KR | 1020090095675 | 9/2009 |

OTHER PUBLICATIONS

Park et al, "Crystal Structures and Luminescent Propeties of AlN-deficient Eu2+-activated Ca-alpha-SiAlON Phosphor", Journal of the Korean Physical Society, vol. 57, No. 4, Oct. 15, 2010, pp. 900-993.*
Park, S-S., et al., "Crystal Structures and Luminescence Properties of AlN-deficient Eu2+-activated Ca-α-SiAlON Phosphor", Journal of the Korean Physical Society, vol. 57, No. 4, Oct. 2010, pp. 990-993.

* cited by examiner

*Primary Examiner* — Carol M Koslow
(74) *Attorney, Agent, or Firm* — Lowe Hauptman & Ham, LLP

(57) ABSTRACT

The present disclosure provides α-SiAlON phosphors, a method of preparing the same, and an LED chip package using the same. The method includes weighing and mixing raw materials of $Ca_{0.8-x}Re_xAl_{ay}Si_{12-y}O_{1.2}N_{14.8}$ (Re is a rare-earth element, $0 \leq x \leq 0.2$, $2.6 \leq y \leq 3.0$, and $0.6 \leq a \leq 0.95$), and sintering the mixed raw materials via normal pressure sintering to prepare phosphors having a composition of $Ca_{0.8-x}Re_xAl_{ay}Si_{12-y}O_{1.2}N_{14.8}$.

17 Claims, 4 Drawing Sheets

ALUMINUM DEFICIENT α-SIALON PHOSPHORS, METHOD OF PREPARING THE SAME, AND LED CHIP PACKAGE USING THE SAME

CROSS-REFERENCE TO RELATED APPLICATION

This application claims the benefit under 35 U.S.A. §119 of Korean Patent Application No, 10-2011-0035395, filed on Apr. 15, 2011 in the Korean Intellectual Property Office, the entirety of which is incorporated herein by reference.

BACKGROUND

1. Technical Field

The present invention relates to a phosphor preparation technique, and more particularly to a method of preparing α-SiAlON phosphors using normal pressure sintering.

2. Description of the Related Art

White tight emitting diodes (LEDs) have various advantages, such as high efficiency, long lifespan and low power consumption, and many studies have been conducted to develop next generation light sources based on such white LEDs.

$Y_3Al_5O_{12}$:$Ce^{3+}$ (hereinafter referred to as YAG) is a yellow phosphor, which is packaged together with a blue LED chip emitting light having a wavelength of about 460 nm and is widely applied to LEDs in the art. However, YAG has a color rendering index (CRI) of about 75%, which is too low to be applied to a light source for lighting.

Two methods are used to increase the color rendering index of YAG. In one method, green and red phosphors are packaged together with a blue LED chip. In another method, blue, green and red phosphors are packaged together with a UV LED chip which emits light having a wavelength of about 405 nm. Particularly, the UV LED chip packaged together with the RGB phosphors has higher emission intensity than that of a blue LED chip and is thus suggested as a next generation light source for lighting.

On the other hand, various nitride and oxy-nitride phosphors can absorb light having wavelengths in the range of about 390 to 460 nm and are considered to be applicable to LED products. $Eu^{2+}$-doped Ca-α-SiAlON is an orange phosphor and has a crystal structure which exhibits excellent chemical and mechanical stability. It is known that SiAlON is structurally stabilized by doping Y, Li, Ca, and rare-earth elements.

As green or yellow phosphors, $Ce^{3+}$ or $Eu^{2+}$-doped M-α-SiAlON (M=Y, Ca) phosphors may be used. Here, it is very important for the M-α-SiAlON (M=Y, Ca) phosphors to have a single α-phase. For this reason, the $Ce^{3+}$ or $Eu^{2+}$-doped M-α-SiAlON phosphors have been prepared via gas pressure sintering.

However, gas pressure sintering requires a complicated process, thereby significantly increasing phosphor preparation costs.

BRIEF SUMMARY

The present invention provides a method of preparing α-SiAlON phosphors using normal pressure sintering while securing formation of a single α-phase.

The present invention also provides α-SiAlON phosphors which have a composition of $Ca_{0.8-x}Re_xAl_ySi_{12-y}O_{1.2}N_{14.8}$ (Re is a rare-earth element, $0<x\leq0.20<x\leq0.2$, and $2.6\leq y\leq3.0$), and from which unreacted MN has been removed.

The present invention also provides an LED chip package which is manufactured using the α-SiAlON phosphors and exhibits excellent brightness.

In accordance with an aspect of the present invention, a method of preparing α-SiAlON phosphors includes: (a) weighing and mixing raw materials of $Ca_{0.8-x}Re_xAl_ySi_{12-y}O_{1.2}N_{14.8}$ (Re is a rare-earth element, $0<x\leq0.2$, $2.6\leq y\leq3.0$, and $0.6\leq a\leq0.95$); and (b) sintering the mixed raw materials via normal pressure sintering to prepare phosphors having a composition of $Ca_{0.8-x}Re_xAl_{ay}Si_{12-y}O_{1.2}N_{14.8}$.

In the formula. "a" may be in the range of $0.7\leq a\leq0.9$.

Further, the raw materials of $Ca_{0.8-x}Re_xAl_{ay}Si_{12-y}O_{1.2}N_{14.8}$ may include $CaCO_3$, AlN, α-$Si_3N_4$ and a rare-earth oxide, and $CaCO_3$, AlN, α-$Si_3N_4$ and the rare-earth oxide may be mixed in a mole ratio of 0.8−x:ay:12−y:x ($0<x\leq0.2$, $2.6\leq y\leq3.0$, $0.6\leq a\leq0.95$). In this case, carbon may be removed in the form of $CO_2$ from $CaCO_3$ through heat treatment before the normal pressure sintering.

In accordance with another aspect of the present invention, there are provided α-SiAlON phosphors having a composition of $Ca_{0.8-x}Re_xAl_{ay}Si_{12-y}O_{1.2}N_{14.8}$ ($0.6\leq a\leq0.95$) deficient in Al from $Ca_{0.8-x}Re_xAl_ySi_{12-y}O_{1.2}N_{14.8}$ (Re is a rare-earth element, $0<x\leq0.2$, $2.6\leq y\leq3.0$, and $0.6\leq a\leq0.95$).

In accordance with a further aspect of the present invention, an LED chip package includes an LED chip emitting UV or blue light; and α-SiAlON phosphors packaged together with the LED chip and having a composition of $Ca_{0.8-x}Re_xAl_{ay}Si_{12-y}O_{1.2}N_{14.8}$ (Re is a rare-earth element, $0<x\leq0.2$, $2.6\leq y\leq3.0$, and $0.6\leq a\leq0.95$).

BRIEF DESCRIPTION OF THE DRAWINGS

The above and other aspects, features, and advantages of the invention will become apparent from the following detailed description of exemplary embodiments in conjunction with the accompanying drawings, in which.

DETAILED DESCRIPTION

Exemplary embodiments of the invention will now be described in detail with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited only by the accompanying claims and equivalents thereof.

Hereinafter, Al-deficient α-SiAlON phosphors, a method of preparing the same, and an LED chip package according to exemplary embodiments of the present invention will be described with reference to the accompanying drawings.

Figure 1:
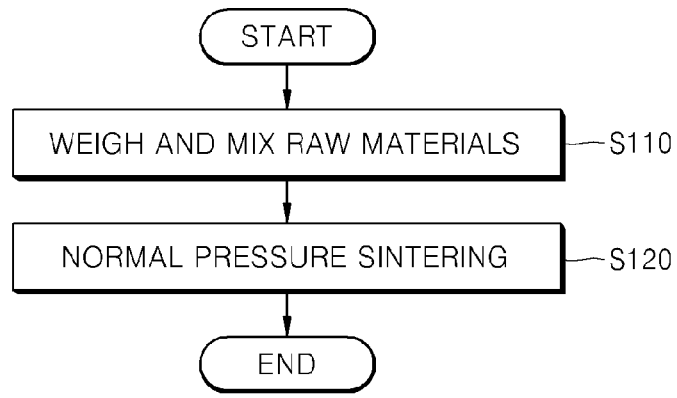
FIG. 1 is a schematic flowchart of a method of preparing α-SiAlON phosphors in accordance with an exemplary embodiment of the present invention.

FIG. 1 is a schematic flowchart of a method of preparing α-SiAlON phosphors in accordance with an exemplary embodiment of the present invention.

Referring to FIG. 1, the α-SiAlON phosphor preparation method according to this embodiment includes a raw material weighing and mixing operation S110 and a normal pressure sintering operation S120.

In the raw material weighing and mixing operation S110, raw materials of $Ca_{0.8-x}Re_xAl_{ay}Si_{12-y}O_{1.2}N_{14.8}$ (Re is a rare-earth element, $0<x\leq0.2$, $2.6\leq y\leq3.0$, $0.6\leq a\leq0.95$) are weighed and mixed.

The raw materials may include $CaCO_3$, AlN, α-$Si_3N_4$, and rare-earth oxides. The rare-earth oxides may include Eu2O3. Additionally, the rare-earth oxides may include $Y_2O_3$, $La_2O_3$, $CeO_2$, $Nd_2O_3$, $Sm_2O_3$, $Gd_2O_3$, $Tb_2O_3$, $Dy_2O_3$, $HO_2O_3$, $Er_2O_3$, $Tm_2O_3$, $Yb_2O_3$, $Lu_2O_3$, and the like. These rare-earth oxides may be used alone or in combination of two or more thereof.

In this embodiment, $CaCO_3$, AlN, α-$Si_3N_4$, and the rare-earth oxide are mixed in a mole ratio of 0.8−x:ay:12−y:x ($0<x\leq0.2$, $2.6\leq y\leq3.0$, $0.6\leq a\leq0.95$).

The composition of $Ca_{0.8-x}Re_xAl_{ay}Si_{12-y}O_{1.2}N_{14.8}$ (Re is a rare-earth element, $0<x\leq0.2$, $2.6\leq y\leq3.0$, $0.6\leq a\leq0.95$) is 5-40 mol % deficient in Al, as compared with the composition of $Ca_{0.8-x}Re_xAl_ySi_{12-y}O_{1.2}N_{14.8}$ ($0<x\leq0.2$, $2.6\leq y\leq3.0$).

In this embodiment, the raw materials are 5-40 mol % deficient in MN.

With the composition of $Ca_{0.8-x}Re_xAl_{ay}Si_{12-y}O_{1.2}N_{14.8}$ $0<x\leq0.2$, $2.6\leq y\leq3.0$), a single α-AlSiON phase may be secured by gas pressure sintering. However, when preparing phosphors having this composition via normal pressure sintering, a secondary phase may be formed in addition to the α-AlSiON phase due to the presence of unreacted MN in the phosphors.

However, according to this embodiment, phosphors having a non-stoichiometric composition of $Ca_{0.8-x}Re_xAl_{ay}Si_{12-y}O_{1.2}N_{14.8}$ (Re is a rare-earth element, $0<x\leq0.2$, $2.6\leq y\leq3.0$, $0.6\leq a\leq0.95$), which is decreased in the amount of MN, are prepared by normal pressure sintering, and do not contain unreacted AlN therein.

As a result, it is possible to prepare α-AlSiON phosphors having a single a phase using normal pressure sintering.

In the composition of $Ca_{0.8-x}Re_xAl_{ay}Si_{12-y}O_{1.2}N_{14.8}$, "a" is related to AlN deficiency and may be in the range of $0.6\leq a\leq0.95$. In this case, the degree of AlN deficiency is in the range of 5 to 40 mol %. If "a" exceeds 0.95, the phosphors can contain unreacted AlN. If "a" is less than 0.6, the phosphors do not contain the unreacted AlN, but may have an excess of $Si_3N_4$.

More specifically, "a" may be in the range of $0.7\leq a\leq0.9$, that is, the degree of AlN deficiency is in the range of 10 to 30 mol %. When the degree of MN deficiency is in this range, the phosphors do not contain unreacted MN and unreacted $Si_3N_4$. Further, when the degree of AlN deficiency is in this range, the phosphors have higher emission intensity than phosphors, the degree of Al deficiency of which is not in this range, and may contribute to brightness improvement of LED products.

After weighing the raw materials for the phosphors having a composition of $Ca_{0.8-x}Re_xAl_{ay}Si_{12-y}O_{1.2}N_{14.8}$, the raw materials are mixed.

Mixing the raw materials may be performed using wet milling. As media for wet milling, alcohols such as isopropyl alcohol or ketones such as acetone may be used.

By wet milling, the raw materials are pulverized while being mixed, thereby providing a powder mixture of the raw materials.

Next, in the normal pressure sintering operation S120, the mixed raw materials are subjected to normal pressure sintering to prepare phosphors having a composition of $Ca_{0.8-x}Re_xAl_{ay}Si_{12-y}O_{1.2}N_{14.8}$.

The phosphor according to this embodiment has a composition of $Ca_{0.8-x}Re_xAl_{ay}Si_{12-y}O_{1.2}N_{14.8}$ and does not contain a carbon (C) component. Thus, it is desirable that the carbon component be removed from $CaCO_3$ of the raw materials before normal pressure sintering.

The carbon component may be removed iii the form of $CO_2$ from $CaCO_3$ by heat treatment.

The heat treatment array be performed at 750 to 950° C. for about 4 hours. If the temperature of heat treatment is less than 750° C., the phosphors can be carburized by carbon of $CaCO_3$ due to insufficient thermal decomposition of $CaCO_3$. If the temperature of heat treatment exceeds 950° C., rapid reaction occurs, causing undesired side reactions.

Further, the heat treatment may be performed in an inert gas atmosphere, such as a nitrogen gas atmosphere, in order to prevent undesired reaction except for removal of $CO_2$ from $CaCO_3$.

Herein, the term "normal pressure" in normal pressure sintering means a pressure of about 1 atm.

Normal pressure sintering may be performed in an alumina tube furnace. Further, normal pressure sintering may be performed at 1600 to 1800° C. If the normal pressure sintering is performed at a temperature less than 1600° C., it is difficult to form a crystal structure of the phosphor due to too a tow sintering temperature. If normal pressure sintering is performed at a temperature above 1800° C., the prepared phosphor becomes excessively coarse and a glass phase may be formed due to presence of silicon (Si).

Normal pressure sintering may be performed for about 1 to 3 hours, which may be adjusted according to a sintering temperature. Further, normal pressure sintering may be performed in a mixed gas atmosphere containing hydrogen and nitrogen.

After the normal pressure sintering, the phosphor may be subjected to slow cooling in the furnace in which the normal pressure sintering is performed.

With the process as described above, the prepared α-SiAlON phosphors have a composition of $Ca_{0.8-x}Re_xAl_{ay}Si_{12-y}O_{1.2}N_{14.8}$ ($0.6\leq a\leq0.95$) which is 5 to 40 mol % deficient in Al.

The prepared phosphors absorb blue light and emit yellow light. Further, according to test results, the phosphors absorb UV light having a wavelength of about 400 nm and emit yellow light. Thus, the α-SiAlON phosphors according to this embodiment may be packaged together not only with a blue LED chip but also with a UV LED chip.

In other words, an LED chip according to one exemplary embodiment of the invention may include a UV or blue LED chip and α-SiAlON phosphors having a composition of $Ca_{0.8-x}Re_xAl_{ay}Si_{12-y}O_{1.2}N_{14.8}$ (Re is a rare-earth element, $0<x\leq0.2$, $2.6\leq y\leq3.0$, $0.6\leq a\leq0.95$) and packaged together with the UV or blue LED chip. The phosphors may be deposited on a surface of the LED chip or may be dispersed in a protective layer covering the LED chip.

Example

Next, the present invention will be explained in more detail with reference to the following examples. The examples are provided for illustrative purposes only and are not to be in any way construed as limiting the invention.

A description of details apparent to those skilled in the art will be omitted.

Preparation of α-SiAlON Phosphor Sample $CaCO_3$ (Acros, 99.9 wt %), AlN (Kojundo, 99.9 wt %), α-$Si_3N_4$(LC-12, STarck, α content 90 wt %, oxygen content <1.2 wt %) and $Eu_2O_3$(Kojundo, 99.9 wt %) were used as raw materials for α-SiAlON phosphor samples of one example and a comparative example.

To prepare a phosphor sample of the comparative example, $CaCO_3$, MN, α-$Si_3N_4$ and $Eu_2O_3$ were weighed to obtain a mole ratio of 0.8−x:y:12−y:x (x=1.2, y=0.28).

To prepare a phosphor sample of the example, $CaCO_3$, MN, α-$Si_3N_4$ and $Eu_2O_3$ were weighed to obtain a mole ratio of 0.8−x:ay:12−y:x (x=1.2, y=0.28, a=0.95, 0.90, 0.85, 0.80, 0.75, 0.70, 0.65).

Each of the phosphor samples of the example and the comparative example was prepared by the following method.

First, the weighed raw materials were mixed and subjected to ball milling for two hours using isopropyl alcohol as a medium for wet milling, thereby preparing a powder mix ture.

Then, the powder mixture was subjected to drying at 90° C., and was placed in an alumina boat. The alumina boat was placed in a horizontal tube furnace, followed by heat treatment at 850° C. for 4 hours in a nitrogen atmosphere to evaporate $CO_2$ from $CaCO_3$.

Next, the heat treated powder was subjected to normal pressure sintering at 1680° C. for 2 hours in a mixed gas atmosphere of 30 vol % $H_2$ and 70 vol % $N_2$.

After sintering, each of the prepared phosphor samples of the example and the comparative example was slowly cooled in the furnace.

Evaluation of Properties

Each of the prepared phosphor samples of the example and the comparative example was examined to evaluate X-ray diffraction and luminous properties.

X-ray diffraction testing was performed using a diffraction meter (Rigaku, UMAX 2000, Japan).

Luminous property testing was performed using a luminescence spectrometer (Perkin-Elmer, LS50B, USA).

Figure 2:
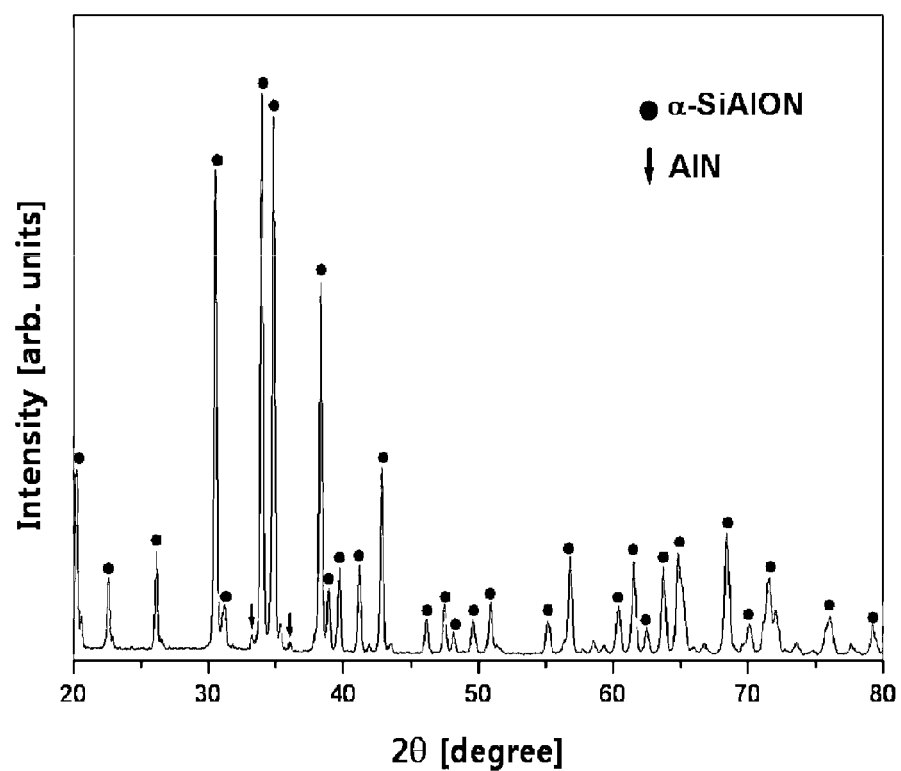
FIG. 2 is a graph of an X-ray diffraction pattern of $Ca_{0.8-x}Re_xAl_{ay}Si_{12-y}O_{1.2}N_{14.8}$ (x=0.12, y=2.8) according to a comparative example, which is not deficient in aluminum.
Figure 3:
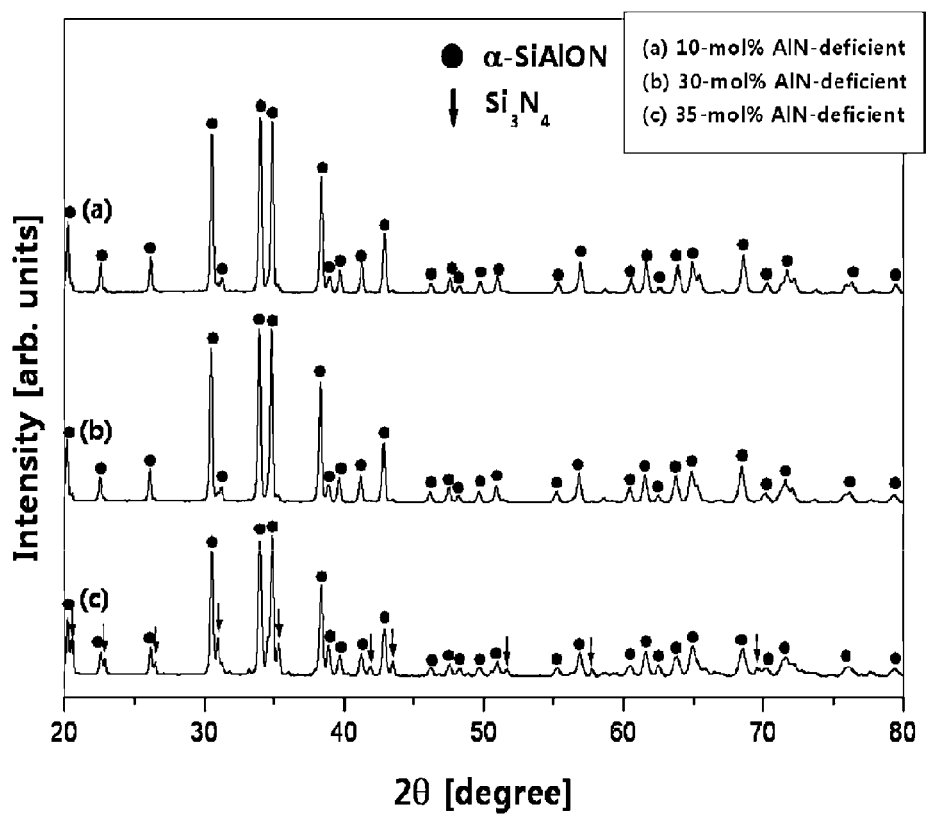
FIG. 3 is a graph of an X-ray diffraction pattern of Al deficient $Ca_{0.8-x}Re_xAl_{ay}Si_{12-y}O_{1.2}N_{14.8}$ (x=0.12, y=2.8, a=0.9, 0.7, 0.65) according to one example of the present invention.

FIG. 2 is a graph of an X-ray diffraction pattern of $Ca_{0.8-x}Eu_xAl_ySi_{12-y}O_{1.2}N_{14.8}$ (x=0.12, y=2.8) according to the comparative example, which is not deficient in aluminum, and FIG. 3 is a graph of an X-ray diffraction pattern of Al-deficient $Ca_{0.8-x}Eu_xAl_{ay}Si_{12-y}O_{1.2}N_{14.8}$ (x=0.12, y=2.8, a=0.9, 0.7, 0.65) according to the example.

Referring to FIG. 2, for the sample of the comparative example which is not deficient in aluminum, that is, $Ca_{0.8-x}Eu_xAl_ySi_{12-y}O_{1.2}N_{14.8}$ (x=0.12, y=2.8), AlN peaks were observed together with α-SiAlON main peaks.

On the other hand, referring to FIG. 3, for the sample of the comparative example which is deficient in aluminum, that is, $Ca_{0.8-x}Eu_xAl_{ay}Si_{12-y}O_{1.2}N_{14.8}$ (x=0.12, y=2.8, a=0.9, 0.7, 0.65), α-SiAlON main peaks were observed, but AlN peaks were not observed. However, for the phosphors at a=0.65, that is, at a degree of Al deficiency of 35 mol %, peaks of unreacted $Si_3N_4$ were observed.

Thus, most preferably, the phosphors have a degree of Al deficiency of 10~30 mol % in the composition of $Ca_{0.8-x}Eu_xAl_{ay}Si_{12-y}O_{1.2}N_{14.8}$ (x=0.12, y=2.8).

Figure 4:
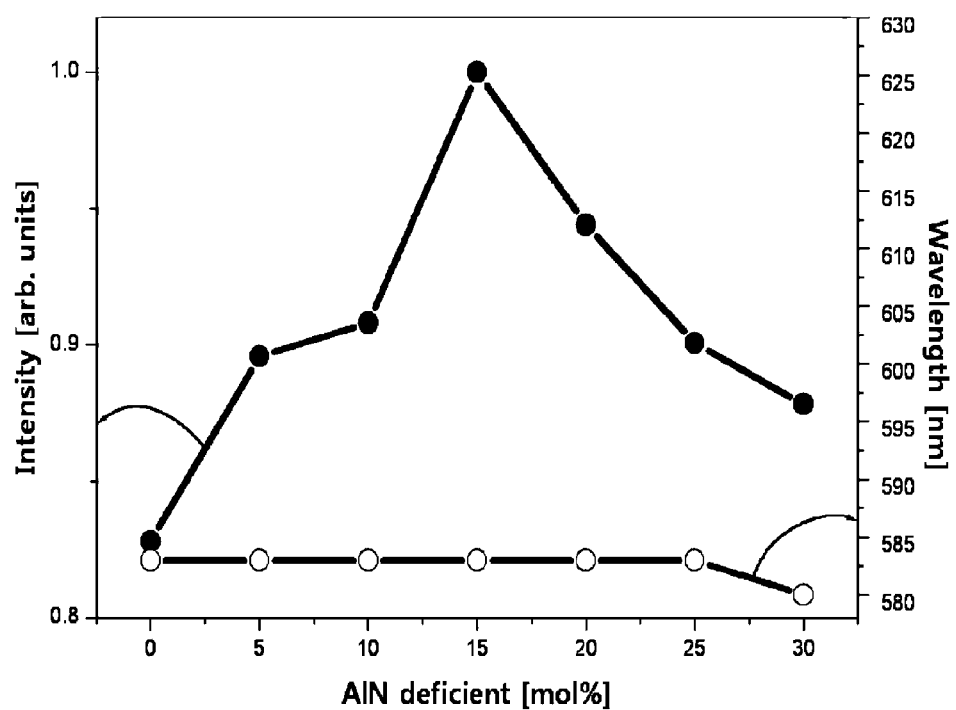
FIG. 4 is a graph depicting variation of emission intensity and wavelengths of α-SiAlON phosphors according to the degree of Al deficiency.

FIG. 4 is a graph depicting variation of emission intensity and wavelengths of α-SiAlON phosphors according to the degree of Al deficiency.

Referring to FIG. 4, it can be seen that emission intensity increases with increasing degree of aluminum deficiency.

Particularly, the α-SiAlON phosphor sample, which is 15 mol % deficient in Al, has about 20% higher emission intensity than the phosphor sample according to the comparative example, which is not deficient in Al.

Further, referring to FIG. 4, both the α-SiAlON phosphor samples of the example and the comparative example have emission peaks corresponding to yellow light having wavelengths of 580-585 nm.

Figure 5:
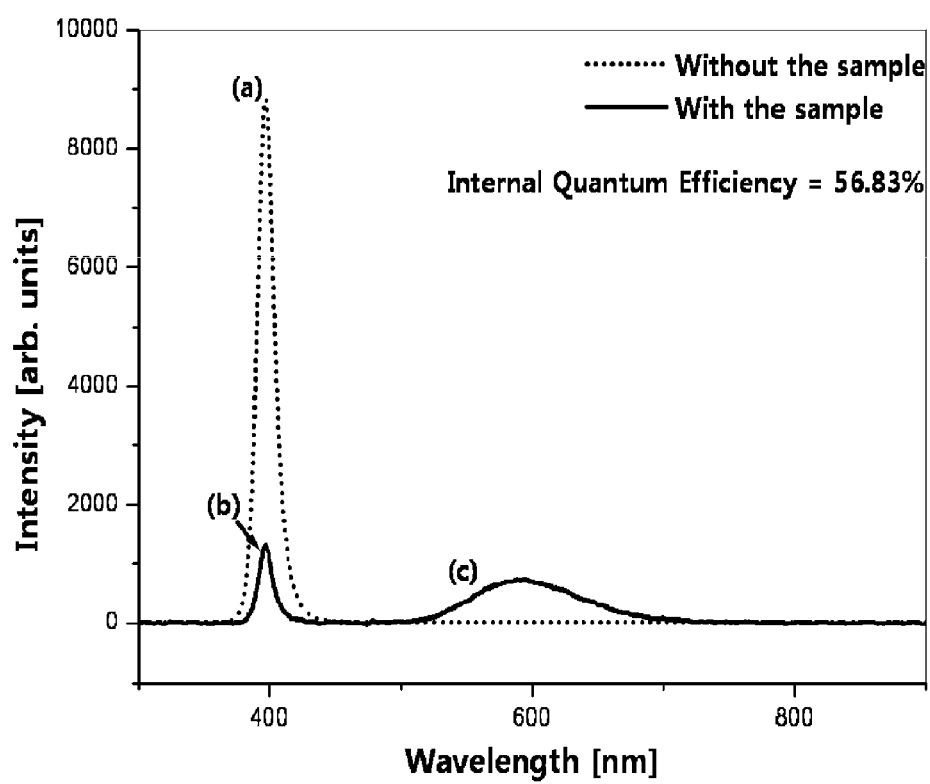
FIG. 5 is a graph of an emission spectrum of an α-SiAlON phosphor sample which is 15 mol % deficient in Al.

FIG. 5 is a graph of an emission spectrum of the α-SiAlON phosphor sample which is 15 mol % deficient in Al.

In FIG. 5, peak (a) indicates an emission intensity at a peak wavelength of UV light extracted from a light source, peak (b) indicates an emission intensity at a peak wavelength of light which is not absorbed by the phosphor sample, and peak (c) indicates an emission intensity at a peak wavelength of light emitted from the α-SiAlON phosphor sample which is 15 mol % deficient in Al.

According to the test results, the α-SiAlON phosphor sample which is 15 mol % deficient in Al has an internal quantum efficiency of 56.83%.

This result shows that the α-SiAlON phosphors according to the present invention may be applied not only to blue LEDs but also to UV LEDs.

As such, according to the invention, the method of preparing α-SiAlON phosphors may ensure formation of a single α-phase through partial deficiency of Al via normal pressure sintering, which is simpler than gas pressure sintering known in the art.

As a result, a secondary phase is not observed in the Al deficient α-SiAlON phosphors, and an LED chip package containing the Al deficient α-SiAlON phosphors has 20% higher brightness than an LED chip package to which non-Al deficient α-SiAlON phosphors are applied.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A method of preparing α-SiAlON phosphors, the method comprising:
    weighing and mixing raw materials of $Ca_{0.8-x}Re_xAl_{ay}Si_{12-y}O_{1.2}N_{14.8}$ (Re is a rare-earth element, 0<x≤0.2, 2.6≤y≤3.0, and 0.6≤a≤0.95); and
    sintering the mixed raw materials via normal pressure sintering to prepare phosphors having a composition $Ca_{0.8-x}Re_xAl_{ay}Si_{12-y}O_{1.2}N_{14.8}$.

2. The method of claim 1, wherein "a" is in the range of 0.7≤a≤0.9.

3. The method of claim 1, wherein the raw materials of $Ca_{0.8-x}Re_xAl_{ay}Si_{12-y}O_{1.2}N_{14.8}$ comprise $CaCO_3$, AlN, α-$Si_3N_4$, and a rare-earth oxide.

4. The method of claim 3, wherein $CaCO_3$, AlN, α-$Si_3N_4$ and the rare-earth oxide are mixed in a mole ratio of 0.8−x:ay:12−y:x (0<x≤0.2, 2.6≤y≤3.0, 0.6≤a≤0.95).

5. The method of claim 3, wherein the rare-earth oxide comprises at least one selected from the group consisting of $Y_2O_3$, $La_2O_3$, $CeO_2$, $Nd_2O_3$, $Sm_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$.

6. The method of claim 1, wherein the raw materials are mixed by wet milling to prepare a powder mixture of the raw materials.

7. The method of claim 6, wherein the wet milling is performed using alcohols or ketones as a milling medium.

8. The method of claim 3, further comprising: heat treating the mixed raw materials to remove a carbon component from $CaCO_3$ in the form of $CO_2$ before sintering the mixed raw materials.

9. The method of claim 8, wherein the heat treatment is performed at a temperature of 750 to 950° C.

10. The method of claim 8, wherein the heat treatment is performed in an inert gas atmosphere.

11. The method of claim 1, wherein the sintering the mixed raw materials is performed at a temperature of 1600 to 1800° C.

12. The method of claim 11, wherein the sintering the mixed raw materials is performed in a mixed gas atmosphere containing hydrogen and nitrogen.

13. α-SiAlON phosphors having a composition of $Ca_{0.8-x}Re_xAl_{ay}Si_{12-y}O_{1.2}N_{14.8}$ (0.6≤a≤0.95) deficient in Al from $Ca_{0.8-x}Re_xAl_{ay}Si_{12-y}O_{1.2}N_{14.8}$ (Re is a rare-earth element, 0<x≤0.2, 2.6≤y≤3.0, and 0.6≤a≤0.95).

14. The α-SiAlON phosphors of claim 13, wherein "a" is in the range of 0.7≤a≤0.9.

15. The α-SiAlON phosphors of claim 13, wherein the phosphors absorb UV or blue light to emit yellow light.

16. An LED chip package comprising:
 an LED chip emitting UV or blue light; and
 α-SiAlON phosphors packaged together with the LED chip and having a composition of $Ca_{0.8-x}Re_xAl_{ay}Si_{12-y}O_{1.2}N_{14.8}$ (Re is a rare-earth element, 0<x≤0.2, 2.6≤y≤3.0, and 0.6≤a≤0.95).

17. The LED chip package of claim 16, wherein "a" is in the range of 0.7≤a≤0.9.

* * * * *